(12) United States Patent
Miyake

(10) Patent No.: US 9,236,876 B2
(45) Date of Patent: Jan. 12, 2016

(54) DOUBLE-INTEGRATION TYPE A/D CONVERTER

(71) Applicant: Rohm Co., Ltd., Kyoto (JP)

(72) Inventor: Takashi Miyake, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 14/630,834

(22) Filed: Feb. 25, 2015

(65) Prior Publication Data

US 2015/0249457 A1 Sep. 3, 2015

(30) Foreign Application Priority Data

Feb. 28, 2014 (JP) ................................ 2014-038062

(51) Int. Cl.

| H03M 1/12 | (2006.01) |
|---|---|
| H03M 1/06 | (2006.01) |
| H02M 1/34 | (2007.01) |
| H02M 1/12 | (2006.01) |
| H03M 1/56 | (2006.01) |

(52) U.S. Cl.
CPC .............. *H03M 1/0629* (2013.01); *H02M 1/12* (2013.01); *H02M 1/34* (2013.01); *H03M 1/56* (2013.01)

(58) Field of Classification Search
CPC ....... H03M 1/34; H03M 1/0629; H03M 1/12; H03M 1/56
USPC .................................................. 341/155, 164
See application file for complete search history.

(56) References Cited

U.S. PATENT DOCUMENTS

| 3,701,146 A | * | 10/1972 | Haga et al. ..................... 341/118 |
| 4,588,981 A | * | 5/1986 | Senn ............................. 341/143 |
| 4,620,178 A | * | 10/1986 | Naito ............................ 341/167 |
| 4,857,933 A | * | 8/1989 | Knight .......................... 341/168 |
| 5,144,307 A | * | 9/1992 | Takatsuka ..................... 341/120 |

FOREIGN PATENT DOCUMENTS

| JP | 04-200017 | 7/1992 |
| JP | 09-269259 | 10/1997 |
| JP | 3549845 | 4/2004 |

* cited by examiner

*Primary Examiner* — Brian Young
(74) *Attorney, Agent, or Firm* — Fish & Richardson P.C.

(57) ABSTRACT

A double-integration type A/D converter for performing A/D conversion by integrating an input voltage and a reference voltage is disclosed. The A/D converter includes an integrator configured to integrate the input voltage and the reference voltage; a first switch configured to relay supply of the input voltage to an input terminal of the integrator; a second switch configured to relay supply of the reference voltage to the input terminal; and a control circuit configured to control switching on and off the first switch and the second switch. The control circuit generates a switching signal that switches on and off the first switch and the second switch individually and a switching signal that switches on and off the first switch and the second switch simultaneously. In addition, superimposition of the input voltage and the reference voltage is integrated when the first switch and the second switch are simultaneously switched on.

18 Claims, 7 Drawing Sheets

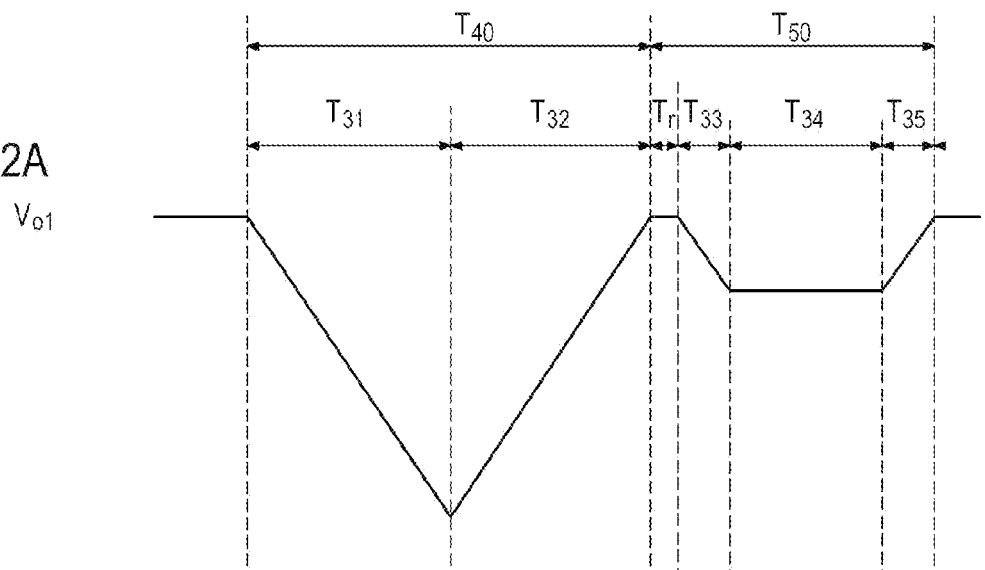
FIG. 2A $V_{o1}$
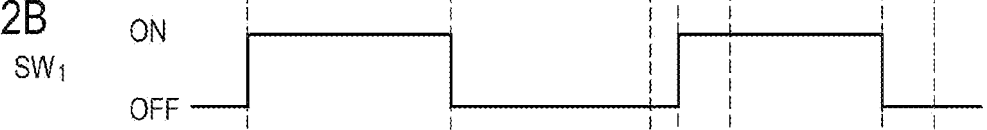
FIG. 2B $SW_1$
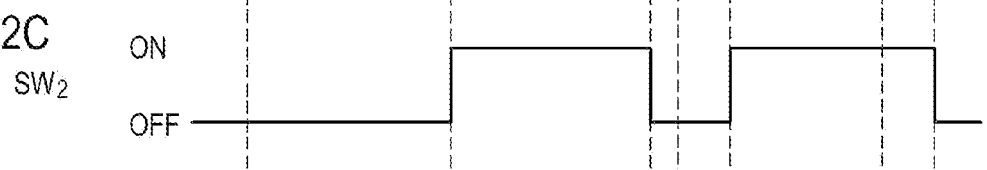
FIG. 2C $SW_2$
FIG. 2D $SW_3$ $V_o$ $SW_1$ $SW_2$ $SW_3$

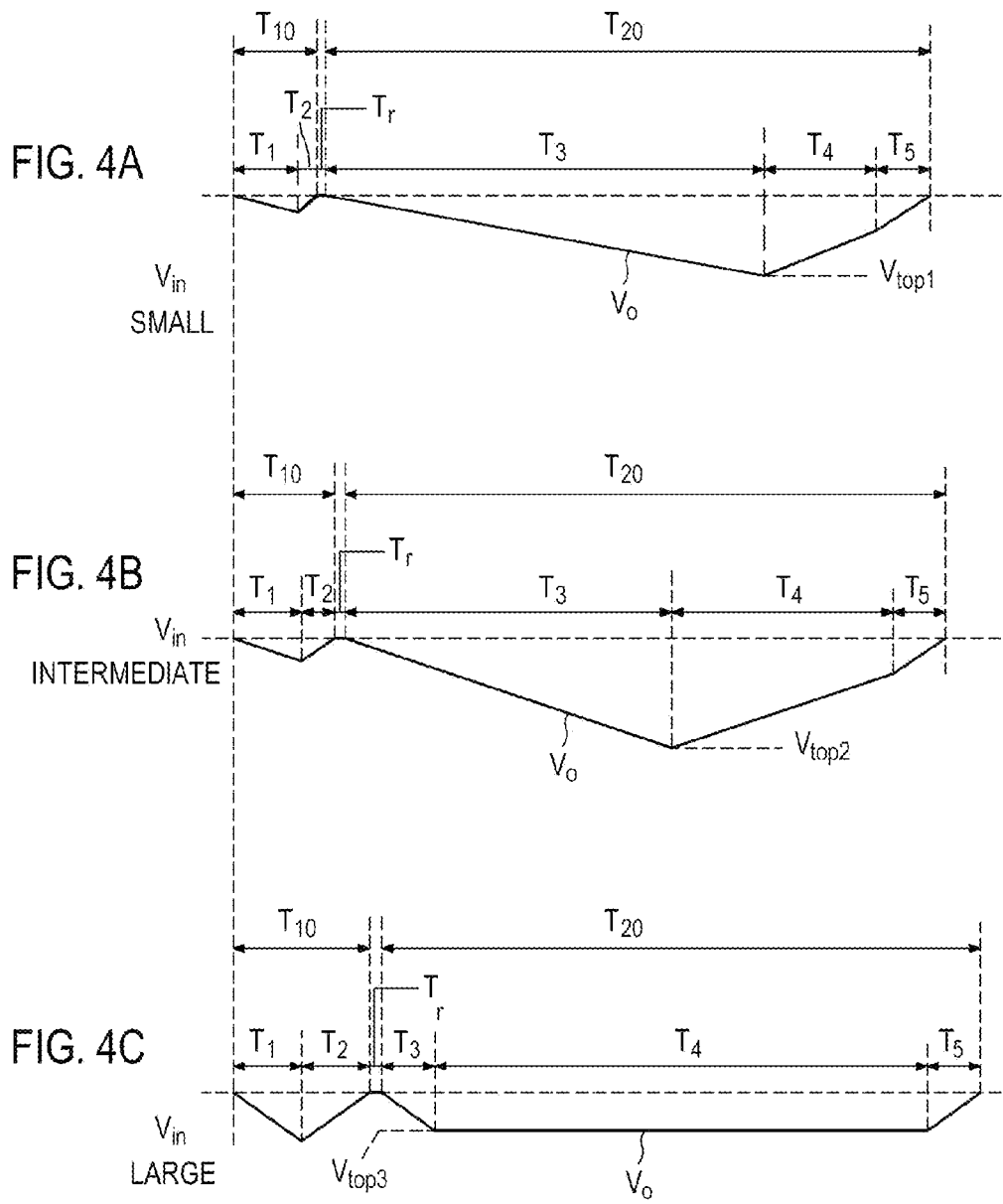

FIG. 7

| | PRESENT DISCLOSURE |
|---|---|
| NOISE IMPACT | 10% |
| MEASUREMENT TIME (INTEGRATION PERIOD) | 68% |
| DYNAMIC RANGE | 30% |

DOUBLE-INTEGRATION TYPE A/D CONVERTER

CROSS-REFERENCE TO RELATED APPLICATION

This application is based upon and claims the benefit of priority from Japanese Patent Application No. 2014-038062, filed on Feb. 28, 2014, the entire contents of which are incorporated herein by reference.

TECHNICAL FIELD

The present disclosure relates to a double-integration type A/D (analog-to-digital) converter used for digital voltmeters, ohm meters, and so on, and more particularly, relates to a double-integration type A/D converter which is capable of achieving high noise tolerance and reduction of measuring time.

BACKGROUND

A double-integration type A/D converter performs A/D conversion by integrating an input voltage for a specified time, integrating a reference voltage whose polarity is opposite to that of the input voltage, and counting the time it takes for an output of an integration circuit to reach a predetermined level.

A conventional technology employs a double-integration type A/D converter which eliminates a zero point error by an offset voltage of an integrator using an operational amplifier. In this type of an A/D converter, integration is performed twice in the same integrator in order to eliminate the zero point error by the offset voltage of the integrator.

Another conventional technology uses an A/D converter in which current having a polarity opposite to that of an input voltage is discharged by a constant current circuit connected to an input side of an integrator during an input voltage integration period or a reference voltage integration period. Thus, this technology may achieve reduction of cost by reduction of A/D conversion time and reduction of the number of bits of a counter circuit.

A still yet another conventional technology adopts an integral type A/D converter which converts an output voltage of a detection circuit such as a bridge circuit for measurement of distortion (e.g., Wheatstone bridge circuit) or the like into digital data. Thus, this technology may achieve fast A/D conversion processing while appropriately eliminating unnecessary components including hum components caused by AC power.

SUMMARY

The present disclosure provides some embodiments of a double-integration type A/D converter, which is capable of improving noise tolerance and reducing measurement time.

According to one aspect of the present disclosure, there is provided a double-integration type A/D converter for performing A/D conversion by integrating an input voltage and a reference voltage, including an integrator configured to integrate the input voltage and the reference voltage; a first switch configured to relay supply of the input voltage to an input terminal of the integrator; a second switch configured to relay supply of the reference voltage to the input terminal; and a control circuit configured to control switching on and off the first switch and the second switch, wherein the control circuit generates a switching signal that switches on and off the first switch and the second switch individually and a switching signal that switches on and off the first switch and the second switch simultaneously, and wherein superimposition of the input voltage and the reference voltage is integrated when the first switch and the second switch are simultaneously switched on.

The control circuit in the double-integration type A/D converter according to the present disclosure may be configured to perform a first act for switching on the first switch and switching off the second switch, a second act for switching off the first switch and switching on the second switch, a third act for switching on the first switch and switching off the second switch, a fourth act for switching on the first switch and the second switch simultaneously, and a fifth act for switching off the first switch and switching on the second switch, and generates the switching signals in accordance with the first to fifth acts. Thus, at least one of the input voltage and the reference voltage may be integrated based on the switching signals.

In the double-integration type A/D converter according to the present disclosure, when a first integration period for the first act is denoted as $T_1$ and a second integration period for the second act is denoted as $T_2$, the second integration period may satisfy a condition of $T_2 \geq \alpha T_1$, where $0.05 \leq \alpha \leq 0.5$. Further, when a third integration period for the third act is denoted as $T_3$, the third integration period may be expressed by an equation of $T_3 = M\{(1+\alpha)T_1 - T_2\}$, where $T_2 \geq \alpha T_1$ and $1 \leq M \leq 16$. Furthermore, when a fourth integration period for the fourth act is denoted as $T_4$, the fourth integration period may be expressed by an equation of $T_4 = M(T_2 - \alpha T_1)$. In addition, when a fifth integration period for the fifth step is $T_5$, the fifth integration period may be expressed by an equation of $T_5 = \alpha M T_1$. Additionally, when a total integration period for the third act to the fifth act is denoted as $T_{20}$, the total integration period may be expressed by an equation of $T_{20} = (1+\alpha)MT_1$. Moreover, the equation of the equation of $T_{20} = (1+\alpha)MT_1$ may be established irrespective of a magnitude of the input voltage.

The control circuit in the double-integration type A/D converter according to the present disclosure may include a comparator configured to compares an output signal from the integrator with a reference voltage; a clock signal generating unit configured to generate a clock signal having a predetermined frequency and a predetermined pulse width; a counter configured to count an integration period required for integration operation based on the clock signal; and an A/D control circuit configured to output the switching signals at a predetermined timing in response to an output from the counter.

BRIEF DESCRIPTION OF THE DRAWINGS

FIGS. 2A to 2D illustrate timing diagrams of a double-integration type A/D converter provided for review before reaching an embodiment of the present disclosure.

FIGS. 4A to 4C illustrate timing diagrams of a double-integration type A/D converter depending on change of an input voltage, according to an embodiment of the present disclosure.

FIG. 7 illustrates a comparison in terms of several characteristics between a double-integration type A/D converter according to the present disclosure and a double-integration type A/D converter in a conventional scheme.

DETAILED DESCRIPTION

Figure 1:
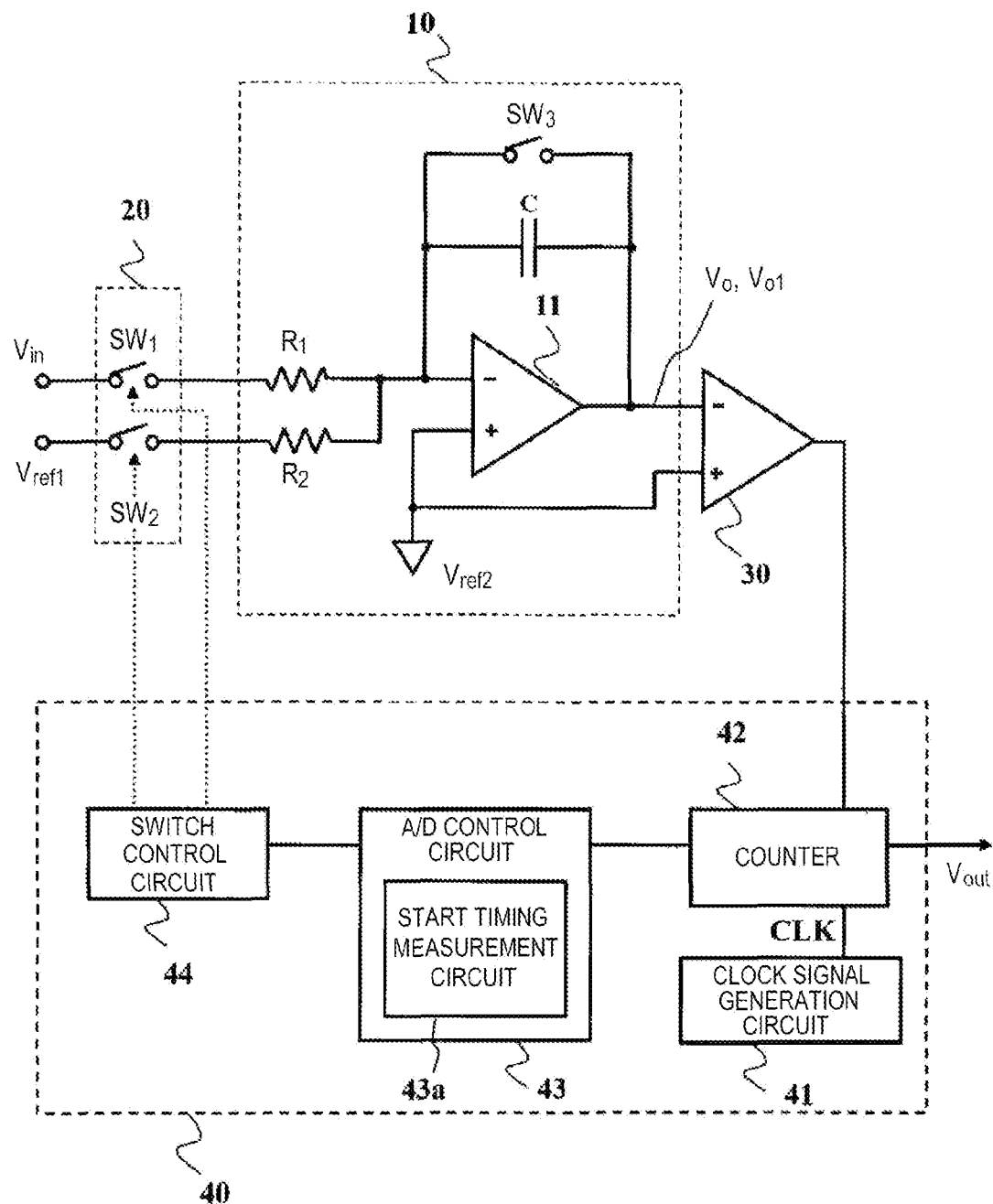
FIG. 1 illustrates a conceptual view of a double-integration type A/D converter according to the present disclosure.

FIG. 1 conceptually illustrates a configuration of a double-integration type A/D converter 100 according to the present disclosure. The double-integration type A/D converter 100 includes an integrator 10, an input switching unit 20, a comparator 30, and a control circuit 40.

The integrator 10 includes an operational amplifier 11, a capacitor C, resistors $R_1$ and $R_2$, and a third switch $SW_3$. The third switch $SW_3$ is installed to initialize the integrator 10. Specifically, the third switch $SW_3$ is configured, when switched on, to remove charge that is accumulated in the capacitor C. The resistors $R_1$ and $R_2$ are connected to an inverted input terminal of the operational amplifier 11, and the capacitor C is connected between the inverted input terminal and an output terminal of the operational amplifier 11. The capacitor C and the third switch $SW_3$ are connected in parallel. A non-inverted input terminal of the operational amplifier 11 is connected to a reference voltage $V_{ref2}$. The resistor $R_1$ functions as an input integrator resistor for use in inputting an input voltage $V_{in}$ to the inverted input terminal (−) of the operational amplifier 11, and the resistor $R_2$ functions as an input integrator resistor for use in inputting a reference voltage $V_{ref1}$ to the inverted input terminal (−) of the operational amplifier 11. Resistance values of the resistors $R_1$ and $R_2$ may be the same or different.

The integrator 10 is configured to integrate a difference between the reference voltage $V_{ref2}$ inputted to the non-inverted input terminal and the input voltage $V_{in}$ (or the reference voltage $V_{ref1}$) inputted to the inverted input terminal by using a time constant which is determined based on the resistors $R_1$ (or $R_2$) and a capacitance of the capacitor C. A voltage according to a result of the above integration is then outputted by the integrator 10.

The input switching unit 20 may be configured to provide an input to the integrator 10 by switching between the input voltage $V_{in}$ and the reference voltage $V_{ref1}$, whose polarity is opposite to that of the input voltage $V_{in}$. The input switching unit 20 includes a first switch $SW_1$ that relays the input voltage $V_{in}$ to the operational amplifier 11, and a second switch $SW_2$ that relays the reference voltage $V_{ref1}$ to the operational amplifier 11.

An example of the input voltage $V_{in}$ may include a voltage signal or the like obtained through amplifying an output voltage of a resistive sensor or a capacitive sensor (not shown) by using a pre-amplifier or the like. In addition, an input component may be a current component instead of a voltage component. Such a voltage signal or a current signal is an analog signal which is to be A/D converted, and is inputted to the inverted input terminal of the operational amplifier 11. A detailed configuration and a detection object of the above sensor may be modified in any other suitable manner.

The comparator 30 has an inverted input terminal, to which outputs of the integrator 10, specifically, output integration voltages $V_o$ and $V_{o1}$, are inputted, and a non-inverted input terminal to which the reference voltage $V_{ref2}$ is inputted. When the output integration voltage $V_o$ becomes equal to the reference voltage $V_{ref2}$, a high or low level signal is outputted from an output side of the comparator 30.

The control circuit 40 is implemented with a logic circuit, and includes a clock signal generation circuit 41, a counter 42, an A/D control circuit 43, and a switch control circuit 44. The A/D control circuit 43 includes a start timing measurement circuit 43a.

In the control circuit 40, the clock signal generation circuit 41 generates a clock signal CLK, the counter 42 counts the clock signal CLK, and the A/D control circuit 43 calculates an integration period of the reference voltage $V_{ref1}$ based on a counted value of the counter 42 and outputs the calculated integration period to the switch control circuit 44.

The counter 42 outputs an output digital voltage $V_{out}$ which is obtained by counting and digitalizing a time of the integration period based on the clock signal CLK. The start timing measurement circuit 43a sets the time of the integration period and an integration starting timing. Switching the first switch $SW_1$ and the second $SW_2$ on and off is determined depending on the set timing and integration time.

FIGS. 2A to 2D illustrate timing diagrams of a double-integration type A/D converter provided for review before describing an embodiment of the present disclosure. An integration waveform shown in FIG. 2A is a conventionally used waveform. Specifically, FIGS. 2A to 2D of the present disclosure depict an integration method where double-integration is performed twice. As illustrated, a first double-integration includes a first integration period $T_{31}$ and a second integration period $T_{32}$. A first total integration period $T_{40}$ is equal to a sum of the first integration period $T_{31}$ and the second integration period $T_{32}$. A second double-integration includes a third integration period $T_{33}$, a fourth integration period T34, and a fifth integration period $T_{35}$. A second total integration period $T_{50}$ is equal to a sum of the third integration period $T_{33}$, the fourth integration period T34, the fifth integration period T35, and a reset period Tr. The present disclosure is significantly different from the conventional technology in integration of the third to fifth integration periods $T_{33}$ to $T_{35}$, and is characterized, for example, by the fourth integration period $T_{34}$, details of which will be described later.

FIG. 2A illustrates a change of an integration waveform of an output integration voltage $V_{o1}$ of the integrator 10, FIG. 2B illustrates on-and-off timings of the first switch $SW_1$, FIG. 2C illustrates on-and-off timings of the second switch $SW_2$, and FIG. 2D illustrates on-and-off timings of the third switch $SW_3$. The timing diagrams of FIGS. 2A to 2D is described below with reference to FIG. 1.

FIG. 2A depicts five integration periods and one reset period, specifically, the first integration period $T_{31}$ for integrating the input voltage $V_{in}$, the second integration period $T_{32}$ for integrating the reference voltage $V_{ref1}$ whose component is opposite to that of the input voltage $V_{in}$, the reset period $T_r$ for removing residual charge of the integrator 10, the third integration period $T_{33}$ for integrating the input voltage $V_{in}$, the fourth integration period $T_{34}$ for integrating superimposition of the input voltage $V_{in}$ and the reference voltage $V_{ref1}$, and the fifth integration period $T_{35}$ for integrating the reference voltage $V_{ref1}$.

FIGS. 2B, 2C, and 2D depict switching signals for switching on and off the first to third switches $SW_1$ to $SW_3$, respectively. The switching signals are generated by the control circuit 40. As used herein, the terms "first step" to "fifth step"

indicate durations of switching on and off the first to third switches $SW_1$ to $SW_3$. The steps correspond to the above described first to fifth integration periods, respectively. For example, the first step corresponds to a switching state of the first to third switches $SW_1$ to $SW_3$ in the first integration period $T_{31}$. Similarly, the second step, the third step, the fourth step, and the fifth step correspond to switching states of the first to third switches $SW_1$ to $SW_3$ in the second integration period $T_{32}$, the third integration period $T_{33}$, the fourth integration period $T_{34}$, and the fifth integration period $T_{35}$, respectively.

As illustrated in FIG. 2A, in the first step (i.e., the first integration period $T_{31}$), the first switch $SW_1$, the second switch $SW_2$, and the third switch $SW_3$ are set to be on, off, and off, respectively. Thus, the input voltage $V_{in}$ is applied to the inverted input terminal of the operational amplifier 11 via the resistor $R_1$, and integrated for a predetermined period of time.

In the second step (i.e., the second integration period $T_{32}$), the first switch $SW_1$, the second switch $SW_2$, and the third switch $SW_3$ are set to be off, on, and off, respectively. In this operation, the reference voltage $V_{refl}$ is applied to the inverted input terminal of the operational amplifier 11 via the resistor $R_2$, and integrated for a predetermined period of time.

The reset period $T_r$ is set to be a short period as a transition from the second step to the third step. In the reset period $T_r$, the first switch $SW_1$, the second switch $SW_2$, and the third switch $SW_3$ are set to be off, off, and on, respectively. The reset period $T_r$ is provided to initialize (or reset) the integrator 10 by discharging charge that is accumulated in the capacitor C during transition to the following third step (i.e., the third integration period $T_{33}$).

In the third step (i.e., the third integration period $T_{33}$), the first switch $SW_1$, the second switch $SW_2$, and the third switch $SW_3$ are set to be on, off, and off, respectively. In the third step, the input voltage $V_{in}$ is inputted to the integrator 10, and integrated for a predetermined period of time.

In the fourth step (i.e., the fourth integration period $T_{34}$), the first switch $SW_1$, the second switch $SW_2$, and the third switch $SW_3$ are set to be on, on, and off, respectively. In the fourth step, both of the input voltage $V_{in}$ and the reference voltage $V_{refl}$ are inputted to the integrator 10. In this operation, since a polarity of the reference voltage $V_{refl}$ is opposite to that of the input voltage $V_{in}$, a voltage difference between the voltages is integrated. Specifically, in the fourth integration period $T_{34}$, superimposition of the input voltage $V_{in}$ and the reference voltage $V_{refl}$ is inputted to the integrator 10. Since the polarity of the input voltage $V_{in}$ is opposite to that of the reference voltage $V_{refl}$, noise in the input voltage $V_{in}$ can be cancelled with noise in the reference voltage $V_{refl}$ in the integration period of the above voltages. Therefore, tolerance to noise may be improved in the fourth integration period $T_{34}$.

In the fifth step (i.e., the fifth integration period $T_{35}$), the first switch $SW_1$, the second switch $SW_2$, and the third switch $SW_3$ are set to be off, on, and off, respectively. Thus, in the fifth step, only the reference voltage $V_{refl}$ is integrated. In this operation, integrating only the reference voltage $V_{refl}$ is to integrate the remainder of the reference voltage $V_{refl}$.

FIGS. 2A to 2D show an integration scheme of performing the double-integration twice as described above. In this integration scheme, since the superimposition of the input voltage $V_{in}$ and the reference voltage $V_{refl}$ whose polarity is opposite to that of the input voltage $V_{in}$ is integrated, tolerance to noise may be improved. However, since the above integration performs the double integration twice and, particularly, the first integration period $T_{31}$ and the second integration period $T_{32}$ are relatively long, a long integration time in total is still problematic.

FIGS. 3A to 3D illustrates an embodiment of the present disclosure, which is implemented to overcome the problem described with reference to FIGS. 2A to 2D. FIGS. 3A to 3D shows integration periods of the input voltage $V_{in}$ and the reference voltage $V_{refl}$ according to the present disclosure, in which the integration periods proceed according to on-and-off states of the first to third switches $SW_1$ to $SW_3$. FIGS. 3A to 3D are significantly different from FIGS. 2A to 2D in that a first integration period $T_1$ and a second integration period $T_2$ are shortened to reduce measurement time. An integration time of the integration period T34, shown in FIG. 2A, in which the input voltage $V_{in}$ and the reference voltage $V_{refl}$ are superimposed, can be halved theoretically. Accordingly, the inventor of the present disclosure has attempted to reduce the first integration period $T_1$ and the second integration period $T_2$ such that the measurement time amounts to about 70% of the conventional measurement time. The first integration period $T_1$ and the second integration period $T_2$ are set to be $1/M$ (where M is an integration period factor, e.g., $1 \leq M \leq 16$) of the integration periods $T_{31}$ and $T_{32}$ shown in FIG. 2A, respectively. From the viewpoint of integration time and integration accuracy, the integration period factor M may be set to fall within a range of $1 \leq M \leq 16$ based on results from a simulation. The third integration period $T_3$ and the fourth integration period $T_4$ may be set to be suitable time periods determined by a user, and may be about 500 μs which is the same as the integration periods $T_{31}$ and $T_{32}$ shown in FIG. 2A.

Figure 3A:
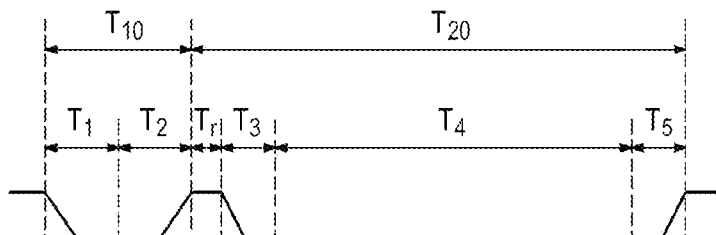
FIGS. 3A to 3D illustrate timing diagrams of a double-integration type A/D converter according to an embodiment of the present disclosure.

If the integration period factor M is set to be 1, FIG. 3A has the same configuration as FIG. 2A. If the integration period factor M is set to be 8, an integration period $T_{10}$ corresponding to a sum of the first integration period $T_1$ and the second integration period $T_2$ is set to be about ⅛ of the integration period $T_{40}$ shown in FIG. 2A. The integration period factor M is set based on a total integration time. If the integration period factor M is set to be large, the total integration time can be reduced but the input voltage $V_{in}$ and the reference voltage $V_{refl}$ may not be integrated with high precision. On the other hand, if the integration period factor M is set to be small, the input voltage $V_{in}$ and the reference voltage $V_{refl}$ may be integrated with high precision, but the total integration time may not be reduced sufficiently.

Figure 3B:
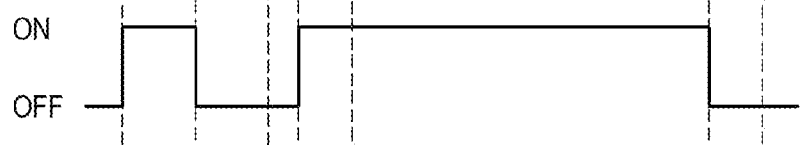
Figure 3C:
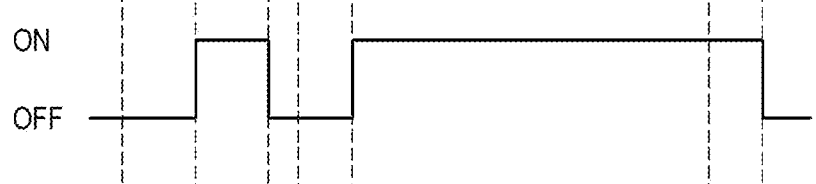
Figure 3D:
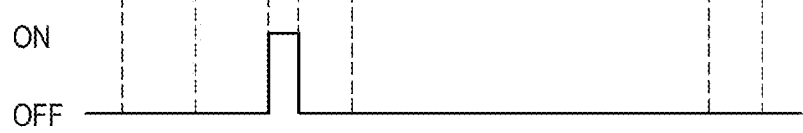

FIG. 3A illustrates a change of an integration waveform of the output integration voltage $V_o$, FIG. 3B illustrates on-and-off timings of the first switch $SW_1$, FIG. 3C illustrates on-and-off timings of the second switch $SW_2$, and FIG. 3D illustrates on-and-off timings of the third switch $SW_3$.

FIG. 3A depicts the changes of the waveform of the output integration voltage $V_o$, which shortens the first integration period $T_{31}$ and the second integration period $T_{32}$ as illustrated in FIG. 2A by respective switching operations.

Assuming that the sum of the third integration period $T_3$ and the fourth integration period $T_4$ is $t_0$, the first integration period $T_1$ in FIG. 3A may be set as $T_1 = t_0/M$ (where M is the integration period factor, $1 \leq M \leq 16$). A range of the integration period factor M is obtained according to simulation based on integration time and integration accuracy in the same manner as described above. The second integration period $T_2$ may be an integration period taken until the reference voltage $V_{refl}$ reaches a predetermined level after the input voltage $V_{in}$ is integrated for the first integration period $T_1$. The reset period $T_r$ may be a period for removing charge remaining in the integrator 10. The third integration period $T_3$ may be determined based on the first integration period $T_1$ and the second integration period $T_2$, and thus, may be expressed as $T_3 = M\{(1+\alpha)T_1 - T_2\}$, where $0.05 \leq \alpha \leq 0.5$, $1 \leq M \leq 16$, and $T_2 \leq \alpha T_1$. The fourth integration period $T_4$ may be a period for supplying the input voltage $V_{in}$ and the reference voltage $V_{refl}$ simultaneously. The fourth integration period $T_4$ may be expressed as $T_4=M(T_2-\alpha T_1)$, where $0.05 \leq \alpha \leq 0.5$, $1 \leq M \leq 16$, and $T_2 \geq \alpha T_1$. The fifth integration period $T_5$ is for the reference voltage $V_{ref1}$ and may be expressed as $T_5=\alpha MT_1$, where $0.05 \leq \alpha \leq 0.5$, $1 \leq M \leq 16$ and $T_2 \geq \alpha T_1$. From the viewpoint of integration time and integration accuracy, an integration period margin factor $\alpha$ may be set to fall within a range of $0.05 \leq \alpha \leq 0.5$ as results from a simulation.

FIG. 3B illustrates a timing diagram of a switching signal that switches the first switch $SW_1$ on and off. The switching signal in FIG. 3B controls the first switch $SW_1$ to input the input voltage $V_{in}$ to the inverted input terminal of the operational amplifier 11 via the resistor $R_1$ when the switch $SW_1$ is switched on. The first switch $SW_1$ is controlled by the control circuit 40 to be switched on in the first integration period $T_1$, the third integration period $T_3$, and the fourth integration period $T_4$, and switched off in the second integration period $T_2$ and the fifth integration period $T_5$.

FIG. 3C illustrates a timing diagram of a switching signal that switches the second switch $SW_2$ on and off. The switching signal in FIG. 3C controls the second switch $SW_2$ to input the reference voltage $V_{ref1}$ to the inverted input terminal of the operational amplifier 11 via the resistor $R_2$ when the switch $SW_2$ is switched on. The second switch $SW_2$ is controlled by the control circuit 40 to be switched on in the second integration period $T_2$, the fourth integration period $T_4$, and the fifth integration period $T_5$, and switched off in the first integration period $T_1$ and the third integration period $T_3$.

FIG. 3D illustrates a timing diagram of a switching signal that switches the third switch $SW_3$ on and off. The switching signal in FIG. 3D switches on the third switch $SW_3$ to initialize the integrator 10 by discharging residual charge in the integrator 10. The third switch $SW_3$ is controlled by the control circuit 40 so that it can be switched on in the reset period $T_r$ and switched off in the first integration period $T_1$, the second integration period $T_2$, the third integration period $T_3$, the fourth integration period $T_4$, and the fifth integration period $T_5$. The control circuit 40 generates the switching signals as shown in FIGS. 3B, 3C, and 3D.

FIGS. 4A to 4C schematically illustrate integration waveforms depending on a magnitude of the input voltage $V_{in}$ in accordance with the embodiment of the present disclosure as described above with reference to FIGS. 1 and 3A to 3D.

FIGS. 4A, 4B, and 4C show changes of the output integration voltage $V_o$ of the integrator 10 according to three cases. Specifically, the cases include when compared with a dynamic range of the integrator 10, a case where the input voltage $V_{in}$ is relatively small, a case where the input voltage $V_{in}$ is approximately intermediate, and a case where the input voltage $V_{in}$ is large. Such cases of the input voltage $V_{in}$ (i.e., small, intermediate, and large) may be based on relative comparison, not based on specified numerical values. For instance, the relatively small input voltage $V_{in}$ corresponds, for example, to ⅓ of the large input voltage $V_{in}$, and the intermediate input voltage $V_{in}$ corresponds, for example, to ⅔ of the large input voltage $V_{in}$. Here, the large input voltage $V_{in}$ may indicate an input voltage of a full limit of the dynamic range of the integrator 10 or an input voltage close to the full limit.

Hereinafter, relationships between time period lengths from the first integration period $T_1$ to the fifth integration period $T_5$ and magnitudes of the input voltage $V_{in}$ are described with reference to FIGS. 4A to 4C. The unit of each integration period will be omitted for convenience of description, and will be described using numerical values.

FIG. 4A schematically illustrates an integration waveform for the relatively small input voltage $V_{in}$ and lengths of respective integration periods. In the case of a relatively small input voltage $V_{in}$ (i.e., "Small $V_{in}$"), if 1.0 is set as the length of the first integration period $T_1$, 0.3 is designated to the second integration period $T_2$, 6.4 is designated to the third integration period $T_3$, 1.6 is designated to the fourth integration period $T_4$, and 0.8 is designated to the fifth integration period $T_5$. As such, the third integration period $T_3$ is four times as long as the fourth integration period $T_4$.

FIG. 4B schematically illustrates an integration waveform for the approximately intermediate input voltage $V_{in}$ and lengths of respective integration periods. In the case of the approximately intermediate input voltage $V_{in}$ (i.e., "Intermediate $V_{in}$"), if 1.0 is set for the length of the first integration period $T_1$, 0.5 is designated to the second integration period $T_2$, 4.8 is designated to the third integration period $T_3$, 3.2 is designated to the fourth integration period $T_4$, and 0.8 is designated to the fifth integration period $T_5$. As such, the third integration period $T_3$ is 1.5 times as long as the fourth integration period $T_4$, which reduces a difference between the periods when compared with the case of the relatively small input voltage $V_{in}$ as shown in FIG. 4A.

FIG. 4C schematically illustrates an integration waveform for a relatively large input voltage $V_{in}$ and lengths of respective integration periods. The relatively large input voltage $V_{in}$ (i.e., "Large $V_{in}$") indicates the case where the input voltage is applied with the full limit of the dynamic range of the integrator 10. If 1.0 is set for the length of the first integration period $T_1$, 1.0 is designated to the second integration period $T_2$, 0.8 is designated to the third integration period $T_3$, 7.2 is designated to the fourth integration period $T_4$, and 0.8 is designated to the fifth integration period $T_5$. As such, the fourth integration period $T_4$ is nine times as long as the third integration period $T_3$, which indicates that the relationship between the integration periods in FIG. 4B is reversed from that in FIG. 4A. Accordingly, as the input voltage $V_{in}$ is increased, the fourth integration period $T_4$ is extended to increase the time for integrating superimposition of the input voltage $V_{in}$ and the reference voltage $V_{ref1}$, which improves tolerance to noise.

The first integration periods $T_1$ in FIGS. 4A to 4C have the same length since they are set to a predetermined integration time irrespective of the magnitude of the input voltage $V_{in}$.

The second integration period $T_2$ indicates a period where the input voltage $V_{in}$ is switched to the reference voltage $V_{ref1}$, which then starts to be integrated. Specifically, the second integration period $T_2$ indicates a period in which charge accumulated in the integrator 10 during the first integration period $T_1$ is discharged. The length of the second integration period $T_2$ is proportional to the magnitude of the input voltage $V_{in}$. Since a larger input voltage $V_{in}$ extends the second integration period $T_2$, the second integration period $T_2$ is shortest in the case of the small input voltage $V_{in}$, as depicted in FIG. 4A, and longest in the case of the large input voltage $V_{in}$, as depicted in FIG. 4C. The longest second integration period $T_2$ has the same length as the first integration period $T_1$ (i.e., $T_2=T_1$). Generally, $T_2$ is equal to or smaller than $T_1$ (i.e., $T_2 \leq T_1$).

The reset period $T_r$ indicates a period where charge remaining in the integrator 10 is removed, and is set to be a constant time irrespective of the magnitude of the input voltage $V_{in}$. Thus, the reset period $T_r$ is set to be, for example, about 1/10 of the first integration period $T_1$ and the second integration period $T_2$.

The third integration period $T_3$ may be expressed by $T_3=M\{(1+\alpha)T_1-T_2\}$, where $T_2 \geq \alpha T_1$, $0.05 \leq \alpha \leq 0.5$, and $1 \leq M \leq 16$. In this equation, since the second integration period $T_2$ increases as the input voltage $V_{in}$ increases, the third integration period $T_3$ increases in a direction opposite to the magnitude of the input voltage $V_{in}$. Thus, the third integration period $T_3$ is shortened as the input voltage $V_{in}$ increases, whereas the third integration period $T_3$ is extended as the input voltage $V_{in}$ decreases.

The fourth integration period $T_4$ may be expressed by $T_4 = M(T_2 - \alpha T_1)$, where $T_2 \geq \alpha T_1$, $0.05 \leq \alpha \leq 0.5$, and $1 \leq M \leq 16$. The second integration period $T_2$ increases as the input voltage $V_{in}$ increases, as described above. Accordingly, as the input voltage $V_{in}$ increases and thus the second integration period $T_2$ is extended, the fourth integration period $T_4$ is extended. By contrast, as the input voltage $V_{in}$ decreases, the second integration period $T_4$ is shortened.

The fifth integration period $T_5$ may be expressed by $T_5 = \alpha M T_1$, and thus, set to be a predetermined time period without being affected by the magnitude of the input voltage $V_{in}$.

In FIGS. 4A to 4C, the first integration period $T_1$ and the second integration period $T_2$ may correspond to preliminary integration periods, and the third integration period $T_3$, the fourth integration period $T_4$, and the fifth integration period $T_5$ correspond to main integration periods. As such, in the present disclosure, the first integration period $T_1$ and the second integration period $T_2$ need be positioned to be preliminary to performing the main integration. In other words, the first integration period $T_1$ and the second integration period $T_2$ may be pre-measurement for setting integration time periods of the third integration period $T_3$, the fourth integration period $T_4$, and the fifth integration period $T_5$.

FIGS. 4A to 4C, illustrating one embodiment of the present disclosure, show that the integration period $T_{10}$ corresponding to the sum of the first integration period $T_1$ and the second integration period $T_2$, which is required for the so-called pre-measurement, is proportional to the input voltage $V_{in}$. However, the total integration period $T_{20}$ of the third integration period $T_3$ to the fourth integration period $T_5$, which is required for the main measurement, may be expressed by $T_{20} = M(1+\alpha)T_1$, and given a predetermined length without depending on the magnitude of the input voltage $V_{in}$. As such, the integration period $T_{20}$ may be characterized by being constantly set as $T_{20} = M(1+\alpha)T_1$, irrespective of the magnitude of the input voltage $V_{in}$. By setting each of the above integration periods, a total integration time required for measurement of the input voltage $V_{in}$ can be substantially constant regardless of whether the input voltage $V_{in}$ is large or small.

FIGS. 4A to 4C schematically illustrate the output integration voltages $V_o$ and maximum values $V_{top1}$, $V_{top2}$, and $V_{top3}$ of the output integration voltages $V_o$. As illustrated, the maximum values $V_{top1}$, $V_{top2}$, and $V_{top3}$ vary depending on the magnitudes of the input voltage $V_{in}$ and the lengths of the third integration periods $T_3$. The magnitudes of the maximum values $V_{top1}$, $V_{top2}$, and $V_{top3}$ affect the dynamic range of the integrator 10. Specifically, a smaller maximum value provides a higher margin of dynamic range which is advantageous for variation of the output integration voltage $V_o$. A smaller dynamic range can reduce a power supply voltage of the integrator 10, which can lead to power saving.

FIGS. 4A to 4C depict that the maximum values $V_{top1}$, $V_{top2}$, and $V_{top3}$ have a relationship of $V_{top2} > V_{top1} > V_{top3}$. As depicted, the maximum values are not proportional to the magnitude of the input voltage $V_{in}$. The maximum value $V_{top2}$ in the case of the approximately intermediate input voltage $V_{in}$ is largest. Here, as a result of simulation on a relationship between the maximum value $V_{top2}$ and the dynamic range in the case of the approximately intermediate input voltage $V_{in}$, it may be found that the maximum value $V_{top2}$ is about 30% of the dynamic range of the integrator 10. The above aspect can increase a margin of dynamic range of the integrator 10 and further achieve an effect of lowering the power supply voltage to the integrator 10.

Figure 5A:
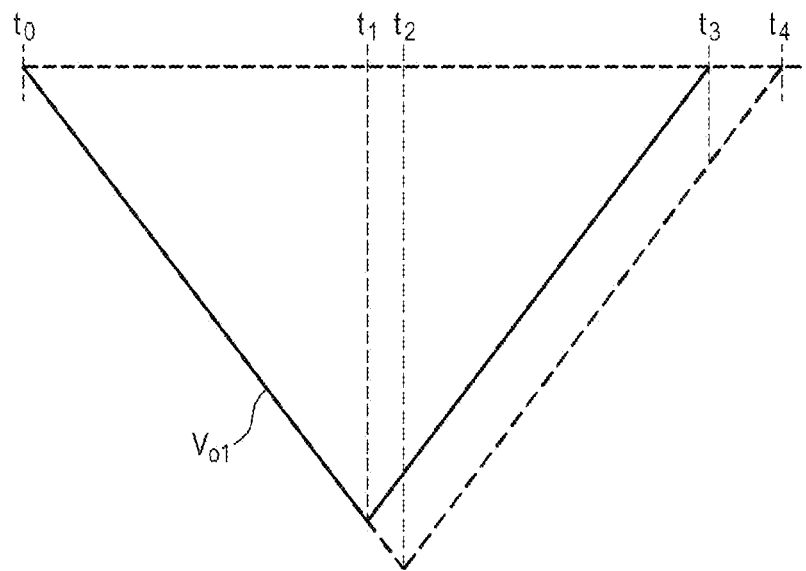
FIGS. 5A and 5B illustrate integration waveforms of a double-integration type A/D converter when a counter is stopped for a predetermined period of time, according to the present disclosure.
Figure 5B:
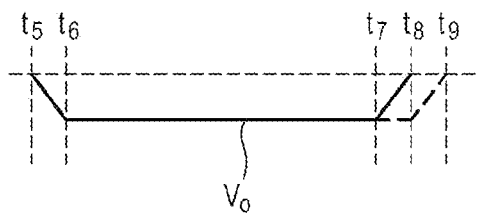

FIGS. 5A and 5B illustrate integration waveforms of main measurement by the double-integration type A/D converter 100 according to the present disclosure and an integration waveform obtained by a conventional double-integration type A/D converter. It is assumed that the counter 42 shown in FIG. 1 is stopped, for example, due to noise or the like for a predetermined period of time.

FIG. 5A illustrates a timing diagram for the conventional double-integration type A/D converter and shows an output integration voltage $V_{o1}$ outputted from the integrator 10. A period from time $t_0$ to time $t_1$ is indicative of an integration period of the input voltage $V_{in}$, and a period from time $t_1$ to time $t_3$ is indicative of an integration period of the reference voltage $V_{ref1}$. A magnitude of an integration voltage obtained by integrating from time $t_1$ to time $t_3$ is outputted as an output digital voltage $V_{out}$ from the counter 42.

In this case, if the counter 42 is stopped during a period from time $t_1$ to time $t_2$ due to noise or the like, integration operation is continued until time $t_2$ according to a difference with time $t_1$ that has been determined previously. Upon reaching time $t_2$, the integration operation is transitioned to integrate the reference voltage $V_{ref1}$. The reference voltage $V_{ref1}$ is integrated until time $t_4$ rather than originally expected time $t_3$, which is longer by an amount of time in which the counter 42 has been stopped due to noise or the like. As such, when the counter 42 is stopped, a time period for integrating the input voltage $V_{in}$ is extended to be longer than a predetermined time period, and a time period for integrating the reference voltage $V_{ref1}$ is also extended by an extended amount of the time period for integrating the input voltage $V_{in}$, which results in an incorrect integration operation.

FIG. 5B illustrates a timing diagram of the double-integration type A/D converter 100 according to the present disclosure and shows an output integration voltage $V_o$ outputted from the integrator 10. A period from time $t_5$ to time $t_6$ is indicative of an integration period of the input voltage $V_{in}$, a period from time $t_6$ to time $t_7$ is indicative of an integration period of superimposition of the input voltage $V_{in}$ and the reference voltage $V_{ref1}$, and a period from time $t_7$ to time $t_8$ is indicative of an integration period of the reference voltage $V_{ref1}$. A magnitude of an integration voltage obtained by integrating from time $t_6$ to time $t_8$ is outputted as an output digital voltage $V_{out}$ from the counter 42.

In this operation, even if the counter 42 is stopped due to noise or the like during the period from time $t_7$ to time $t_8$, the integration period for the reference voltage $V_{ref1}$ corresponds to a period from time $t_6$ to time $t_9$. A period where the output digital voltage $V_{out}$ is outputted corresponds to the period from time $t_6$ to time $t_9$ except for the period from time $t_7$ to time $t_8$ where the counter 42 is stopped. In addition, the period from time $t_8$ to time $t_9$ and the period from time $t_7$ to time $t_8$ are substantially constant irrespective of the magnitude of the input voltage $V_{in}$. Therefore, a time period where the output digital voltage $V_{out}$ is outputted, specifically, the period from time $t_6$ to time $t_9$ except for the period from time $t_7$ to time $t_8$ where the counter is stopped due to noise, becomes equal to a time period from time $t_6$ to time $t_8$. Accordingly, the output digital voltage $V_{out}$ would not be varied due to noise.

Figure 6A:
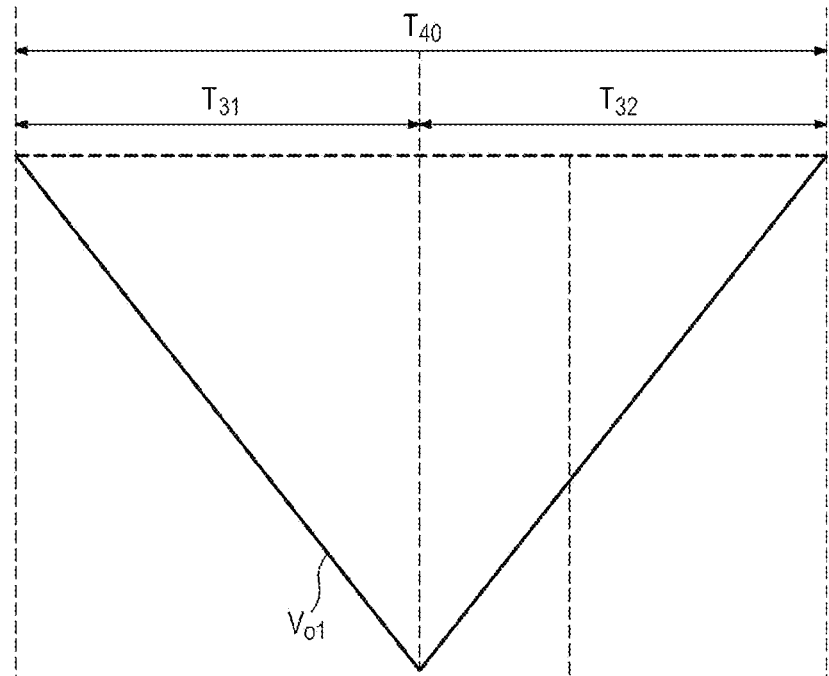
FIGS. 6A and 6B illustrate timing diagrams where integration waveforms are compared between a double-integration type A/D converter according to the present disclosure and a double-integration type A/D converter in a conventional scheme.
Figure 6B:
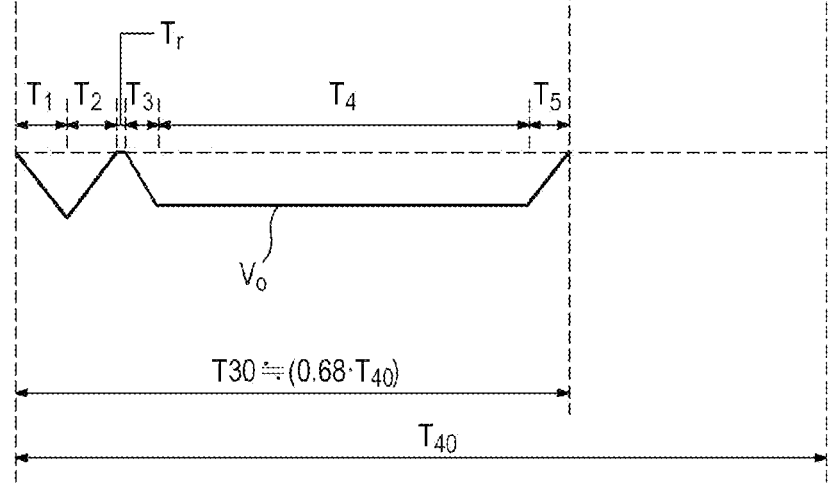

FIGS. 6A and 6B illustrate timing diagrams where integration waveforms are compared between a double-integration type A/D converter according to the present disclosure and a double-integration type A/D converter in a conventional scheme.

FIG. 6A illustrates a timing diagram for the conventional double-integration type A/D converter, and shows an output integration voltage $V_{o1}$ outputted from the integrator 10. As used herein, the term "conventional" refers to an integration scheme performed with the first and second integration periods $T_{31}$ and $T_{32}$ in the manner illustrated in FIGS. 2A to 2D. In FIG. 6A, the first integration period $T_{31}$ corresponds to the integration period of the input voltage $V_{in}$, and the second integration period $T_{32}$ corresponds to the integration period of the reference voltage $V_{ref1}$. In the conventional scheme, the above integration periods may be relatively long depending on the magnitude of the input voltage $V_{in}$.

FIG. 6B illustrates a timing chart for the double-integration type A/D converter according to the present disclosure, and shows an output integration voltage $V_o$ outputted from the integrator 10. By setting the first integration period $T_1$ and the second integration period $T_2$ to 1/M of the conventional integration periods $T_{31}$ and $T_{32}$ (where M is the integration period factor, for example, M=8), respectively, the integration periods can be reduced to ⅛ of the integration periods in the conventional scheme. In addition, as described above, a sum of the third integration period $T_3$, the fourth integration period $T_4$, and the fifth integration period $T_5$ is set based on the first integration period $T_1$ and the second integration period $T_2$, and is maintained to be constant irrespective of the magnitude of the input voltage $V_{in}$. Accordingly, the integration period $T_{30}$ from the first integration period $T_1$ to the fifth integration period $T_5$ amounts to about 70% of the integration period $T_{40}$ in the conventional scheme, which can lead to shortening an integration time.

FIG. 7 illustrates a comparison in terms of noise impact, a measurement time (or integration time), and dynamic range between the present disclosure and the conventional scheme. FIG. 7 is related to FIGS. 6A and 6B. FIG. 7 is described below in conjunction with FIGS. 6A and 6B.

The noise impact is first described below. In the present disclosure, if the integration period factor α is assumed to be 0.1, the noise impact is reduced to about 10% of that of the conventional integration scheme which includes the first integration period $T_{31}$ for integrating the input voltage $V_{in}$ and the second integration period $T_{32}$ for integrating the reference voltage $V_{ref1}$, as shown in FIG. 6A. This is because the noise impact can be significantly suppressed by reducing the first integration period $T_1$ and the second integration period $T_2$ to about ⅛ of the integration periods $T_{31}$ and $T_{32}$ in the conventional scheme and setting an integration time for superimposition of the input voltage $V_{in}$ and the reference voltage $V_{ref1}$ to about 50% or more of a total time period. In addition, if the integration period margin factor α is set to be 0.05, it is found that the noise impact may be further reduced to about 5% of that of the conventional integration scheme. Additionally, if the integration period margin factor α is set to be 0.5, it is found the noise impact may be further increased, when compared with the case where α=0.1, to about 63% of that of the conventional integration scheme. Furthermore, if the input voltage $V_{in}$ is decreased to about ¼ of the large input voltage $V_{in}$, it is found tolerance to noise may be reduced when compared with the case of the large input voltage $V_{in}$.

The comparison of the measurement time (or integration period) is described below. If the integration period margin factor α is 0.1, it is found that the measurement time may be reduced to about 68% of that of the conventional integration scheme. As such, it is found the integration time of the present disclosure may be reduced by 30% or more when compared with the conventional measuring time. The present disclosure that performs a double-integration twice provides a shorter integration time when compared with the conventional scheme that performs a double-integration once. Further, if the integration period margin factor α is set to be 0.05, it is found that the measurement time is reduced to about 65% of that of the conventional integration scheme. Additionally, if the integration period margin factor α is set to be 0.5, it is found that the measurement time is reduced to about 88% of that of the conventional integration scheme. Thus, it can be confirmed that reduction of the measurement time depends on the integration period margin factor α.

The comparison of the dynamic range is described below. If the integration period margin factor α is 0.1, it is found that the dynamic range is reduced to about 30% of that of the conventional integration scheme. This can suppress output variation of the output integration voltage Vo. In addition, such a less dynamic range allows the integrator 10 to be driven with a lower power supply voltage, which can result in power savings.

Further, since the lower power supply voltage of the integrator 10 allows reduction of size of the capacitor C and the resistors R1 and R2 that constitutes the integrator 10, it is possible to further improve compactness and noise tolerance of ICs.

The double-integration type A/D converter according to the present disclosure has a very high industrial applicability since it can improve noise tolerance and reduce measuring time.

The double-integration type A/D converter according to the present disclosure includes a control circuit configured to generate timings at which an input voltage and a reference voltage are separately inputted to an integrator and a timing at which the input voltage and the reference voltage are simultaneously inputted to the integrator. With this configuration, since an addition (i.e., superimposition) of the input voltage and the reference voltage can be integrated based on separate integration of the input voltage and the reference voltage, it is possible to achieve excellent noise tolerance and reduced integration time.

While certain embodiments have been described, these embodiments have been presented by way of example only, and are not intended to limit the scope of the disclosure. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A double-integration type A/D converter for performing A/D conversion by integrating an input voltage and a reference voltage, comprising:
   an integrator configured to integrate the input voltage and the reference voltage;
   a first switch configured to relay supply of the input voltage to an input terminal of the integrator;
   a second switch configured to relay supply of the reference voltage to the input terminal; and
   a control circuit configured to control to open and close the first switch and the second switch,
   wherein the control circuit generates a switching signal that opens and closes the first switch and the second switch individually and a switching signal that opens and closes the first switch and the second switch simultaneously, and wherein superimposition of the input voltage and the reference voltage is integrated when the first switch and the second switch are simultaneously closed.

2. A double-integration type A/D converter for performing A/D conversion by integrating an input voltage and a reference voltage, comprising:
an integrator configured to integrate the input voltage and the reference voltage;
a first switch configured to relay supply of the input voltage to an input terminal of the integrator;
a second switch configured to relay supply of the reference voltage to the input terminal; and
a control circuit configured to control switching on and off the first switch and the second switch,
wherein the control circuit generates a switching signal that switches on and off the first switch and the second switch individually and a switching signal that switches on and off the first switch and the second switch simultaneously,
wherein superimposition of the input voltage and the reference voltage is integrated when the first switch and the second switch are simultaneously switched on,
wherein the control circuit is configured to perform a first act for switching on the first switch and switching off the second switch, a second act for switching off the first switch and switching on the second switch, a third act for switching on the first switch and switching off the second switch, a fourth act for switching on the first switch and the second switch simultaneously, and a fifth act for switching off the first switch and switching on the second switch, and generates the switching signals in accordance with the first to fifth acts, and
wherein the integrator is configured to integrate at least one of the input voltage and the reference voltage based on the switching signals.

3. The double-integration type A/D converter of claim 2, wherein when a first integration period for the first act is denoted as $T_1$ and a second integration period for the second act is denoted as $T_2$, the second integration period satisfies a condition of $T_2 \geq \alpha T_1$, where $0.05 \leq \alpha \leq 0.5$.

4. The double-integration type A/D converter of claim 3, wherein when a third integration period for the third act is denoted as $T_3$, the third integration period is expressed by an equation of $T_3 = M\{(1+\alpha)T_1 - T_2\}$, where $T_2 \geq \alpha T_1$ and $1 \leq M \leq 16$.

5. The double-integration type A/D converter of claim 4, wherein when a fourth integration period for the fourth act is denoted as $T_4$, the fourth integration period is expressed by an equation of $T_4 = M(T_2 - \alpha T_1)$.

6. The double-integration type A/D converter of claim 5, wherein when a fifth integration period for the fifth act is $T_5$, the fifth integration period is expressed by an equation of $T_5 = \alpha M T_1$.

7. The double-integration type A/D converter of claim 6, wherein when a total integration period for the third act to the fifth act is denoted as $T_{20}$, the total integration period is expressed by an equation of $T_{20} = (1+\alpha)MT_1$.

8. The double-integration type A/D converter of claim 7, wherein the equation of $T_{20} = (1+\alpha)MT_1$ is established irrespective of a magnitude of the input voltage.

9. The double-integration type A/D converter of claim 1, wherein the control circuit includes:
a comparator configured to compare an output signal from the integrator with a reference voltage potential;
a clock signal generating unit configured to generate a clock signal having a predetermined frequency and a predetermined pulse width;
a counter configured to count an integration period required for integration operation based on the clock signal; and
an A/D control circuit configured to output the switching signals at a predetermined timing in response to an output from the counter.

10. The double-integration type A/D converter of claim 1, wherein the control circuit is configured to perform a first act for closing the first switch and opening the second switch, a second act for opening the first switch and closing the second switch, a third act for closing the first switch and opening the second switch, a fourth act for closing the first switch and the second switch simultaneously, and a fifth act for opening the first switch and closing the second switch, and generates the switching signals in accordance with the first to fifth acts, and
wherein the integrator is configured to integrate at least one of the input voltage and the reference voltage based on the switching signals.

11. The double-integration type A/D converter of claim 10, wherein when a first integration period for the first act is denoted as $T_1$ and a second integration period for the second act is denoted as $T_2$, the second integration period satisfies a condition of $T_2 \geq \alpha T_1$, where $0.05 \leq \alpha \leq 0.5$.

12. The double-integration type A/D converter of claim 11, wherein when a third integration period for the third act is denoted as $T_3$, the third integration period is expressed by an equation of $T_3 = M\{(1+\alpha)T_1 - T_2\}$, where $T_2 \geq \alpha T_1$ and $1 \leq M \leq 16$.

13. The double-integration type A/D converter of claim 12, wherein when a fourth integration period for the fourth act is denoted as $T_4$, the fourth integration period is expressed by an equation of $T_4 = M(T_2 - \alpha T_1)$.

14. A double-integration type A/D converter for performing A/D conversion by integrating an input voltage and a reference voltage, comprising:
an integrator configured to integrate the input voltage and the reference voltage;
a first switch configured to relay supply of the input voltage to an input terminal of the integrator;
a second switch configured to relay supply of the reference voltage to the input terminal; and
a control circuit configured to open or close the first switch and the second switch,
wherein the control circuit is configured to close the first switch and the second switch at different times from each other and to close the first switch and the second switch simultaneously, and
wherein superimposition of the input voltage and the reference voltage is integrated when the first switch and the second switch are simultaneously closed.

15. The double-integration type A/D converter of claim 14, wherein the control circuit is configured to perform a first act for closing the first switch and opening the second switch, a second act for opening the first switch and closing the second switch, a third act for closing the first switch and opening the second switch, a fourth act for closing the first switch and the second switch simultaneously, and a fifth act for opening the first switch and closing the second switch, and generates the switching signals in accordance with the first to fifth acts, and
wherein the integrator is configured to integrate at least one of the input voltage and the reference voltage based on the switching signals.

16. The double-integration type A/D converter of claim 15, wherein when a first integration period for the first act is denoted as $T_1$ and a second integration period for the second act is denoted as $T_2$, the second integration period satisfies a condition of $T_2 \geq \alpha T_1$, where $0.05 \leq \alpha \leq 0.5$.

17. The double-integration type A/D converter of claim 16, wherein when a third integration period for the third act is denoted as $T_3$, the third integration period is expressed by an equation of $T_3=M\{(1+\alpha)T_1-T_2\}$, where $T_2 \geq \alpha T_1$ and $1 \leq M \leq 16$.

18. The double-integration type A/D converter of claim 17, wherein when a fourth integration period for the fourth act is denoted as $T_4$, the fourth integration period is expressed by an equation of $T_4=M(T_2-\alpha T_1)$.

* * * * *